United States Patent [19]
Hung et al.

[11] Patent Number: 5,965,035
[45] Date of Patent: Oct. 12, 1999

[54] SELF ALIGNED CONTACT ETCH USING DIFLUOROMETHANE AND TRIFLUOROMETHANE

[75] Inventors: Raymond Hung; Jian Ding, both of San Jose; Joseph P. Caulfield, Sunnyvale; Gerald Z. Yin, Cupertino, all of Calif.

[73] Assignee: Applied Materials, Inc., Santa Clara, Calif.

[21] Appl. No.: 08/956,641

[22] Filed: Oct. 23, 1997

[51] Int. Cl.⁶ .................................................. H01L 21/3213
[52] U.S. Cl. .................. 216/72; 216/67; 216/74; 216/79; 438/705; 438/706; 438/710; 438/717; 438/723; 438/724; 438/738; 438/740; 438/743; 438/744
[58] Field of Search ...................... 438/723, 743; 118/723 IR; 156/345; 216/58, 72

[56] References Cited

U.S. PATENT DOCUMENTS 5,286,344  2/1994  Blalock et al. ................. 156/662.1
5,423,945  6/1995  Marks et al. ...................... 156/657

OTHER PUBLICATIONS

Becker et al., "A method of obtaining high oxide to nitride selectivity in an MERIE reactor," *1046b Extended Abstracts*, Spring Meeting, Honolulu (1993). Abstract No. 251. pp. 367–368.

*Primary Examiner*—Bruce Breneman
*Assistant Examiner*—Allan Olsen
*Attorney, Agent, or Firm*—Chuck Guenzer

[57] ABSTRACT

An oxide etch process that is highly selective to nitride, thereby being beneficial for a self-aligned contact etch of silicon dioxide to an underlying thin layer of silicon nitride. The process uses difluoromethane ($CH_2F_2$) for its strong polymer forming and a greater amount of trifluoromethane ($CHF_3$) for its strong etching, and with a high diluent fraction of argon (Ar). The etch process is performed at a low pressure of about 20 milliTorr in a high-density plasma etching chamber.

9 Claims, 1 Drawing Sheet

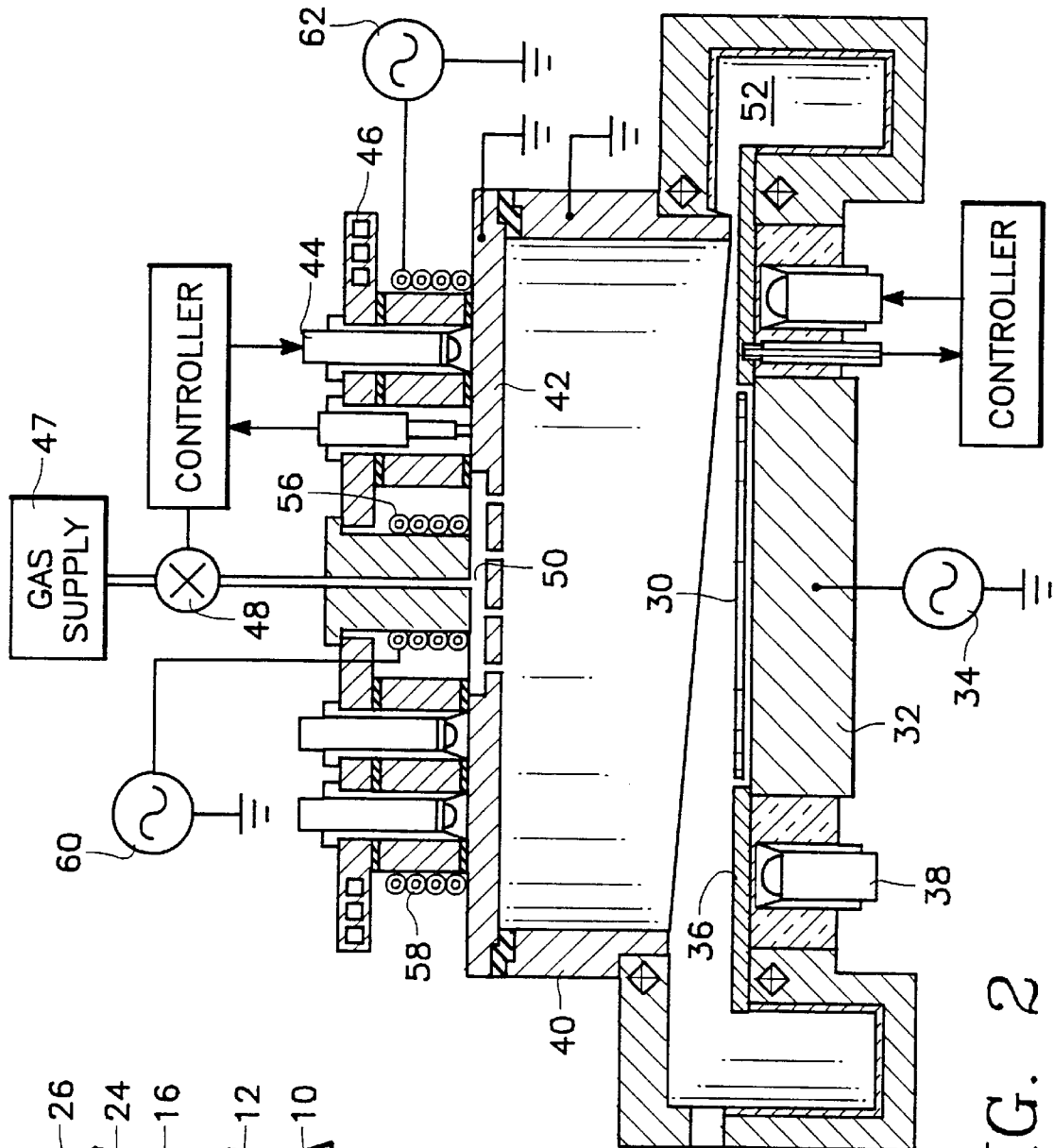

SELF ALIGNED CONTACT ETCH USING DIFLUOROMETHANE AND TRIFLUOROMETHANE

FIELD OF THE INVENTION

The invention relates generally to etching of silicon integrated circuits. In particular, the invention relates to etching silicon oxide in a process that has greatly reduced etching rates for silicon nitride and other non-oxide materials.

BACKGROUND ART

In the fabrication of silicon integrated circuits, the continuing increase in the number of devices on a chip and the accompanying decrease in the minimum feature sizes have placed increasingly difficult demands upon many of the many fabrication steps used in their fabrication including depositing layers of different materials onto sometimes difficult topologies and etching further features within those layers.

Oxide etching has presented some of the most difficult challenges. Oxide is a somewhat generic term used for silica, particularly silicon dioxide ($SiO_2$) although slightly non-stoichiometric compositions $SiO_x$ are also included, as is well known. The term oxide also covers closely related materials, such as oxide glasses including borophosphosilicate (BPSG). Some forms of silicon oxynitride are considered to more closely resemble a nitride than an oxide. Oxide materials are principally used for electrically insulating layers, often between different levels of the integrated circuit. Because of the limits set by dielectric breakdown, the thickness of the oxide layers cannot be reduced to much below 0.5 to 1 $\mu$m. However, the minimum feature size of contact and via holes penetrating the oxide layer is being pushed to well below 0.5 $\mu$m. The result is that the holes etched in the oxide must be highly anisotropic and must have a high aspect ratio of the depth to the minimum width of the hole. A further problem arises from the fact that the underlying silicon may be formed with active doped regions of thicknesses substantially less than the depth of the etched hole (the oxide thickness). Due to manufacturing variables, it has become impossible to precisely time a non-selective oxide etch to completely etch through the silicon oxide without a substantial probability of also etching through the underlying active silicon region.

The anisotropy can be achieved in dry plasma etching in which an etching gas, usually a halocarbon, is electrically excited into a plasma. The plasma conditions may be adjusted to produce highly anisotropic etching in many materials. However, the anisotropy should not be achieved by operating the plasma reactor in a pure sputtering mode in which the plasma ejects particles toward the wafer with sufficiently high energy that they sputter the oxide. Sputtering is generally non-selective, and high-energy sputtering also seriously degrades semiconducting silicon exposed at the bottom of the etched contact hole.

In view of these and other problems, selective etching processes have been developed which depend more upon chemical effects. A sufficiently high degree of selectivity allows new structures to be fabricated without the need for precise lithography for each level.

An example of such an advanced structure is a self-aligned contact (SAC), illustrated in the cross-sectional view of FIG. 1. A SAC structure for two transistors is formed on a silicon substrate 10. A polysilicon gate layer 12, a tungsten silicide barrier and glue layer 14, and a silicon nitride cap layer 16 are deposited and photolithographically formed into two closely spaced gate structures 18 having a gap 20 therebetween. Chemical vapor deposition is then used to deposit onto the wafer a substantially conformal layer 22 of silicon nitride ($Si_3N_4$), which coats the top and sides of the gate structures 18 as well as the bottom 23 of the gap 20. The nitride acts as an electrical insulator. Dopant ions are ion implanted using the gate structures 18 as a mask to form a self-aligned p-type or n-type well 24, which acts as a common source for the two transistors having respective gates 18. The drain structures of the transistors are not illustrated.

An oxide field layer 24 is deposited over this previously defined structure, and a photoresist layer 26 is deposited over the oxide layer 24 and photographically defined into a mask so that a subsequent oxide etching step etches a contact hole 28 through the oxide layer 24 and stops on the underlying nitride layer 22. It is called a contact hole because the metal subsequently deposited into the contact hole 28 contacts silicon rather than a metal layer. A post-etch sputter removes the portion of the nitride layer 22 at the bottom 23 of the gap 20. The silicon nitride acts as an electrical insulator for the metal, usually aluminum, thereafter filled into the contact hole 28.

Because the nitride acts as an insulator, the SAC structure and process offer the advantage that the contact hole 28 may be wider than the width of the gap 20 between the gate structures 18. Additionally, the photographic registry of the gate structures 18 with the contact hole 28 need not be precise. However, to achieve these beneficial effects, the SAC oxide etch must be highly selective to nitride. That is, the process much produce an oxide etch rate that is must greater than the nitride etch rate. Numerical values of selectivity are calculated on the ratio of the oxide to nitride etch rates. Selectivity is especially critical at the corners 29 of the nitride layer 22 above and next to the gap 20 since the corners 29 are the portion of the nitride exposed the longest to the oxide etch and have a geometry favorable to fast etching.

Furthermore, increased selectivity is being required with the increased usage of chemical mechanical polishing (CMP) for planarization. CMP is sensitive to wafer waviness with the effect that a flat oxide surface over a wavy substrate results in an oxide of significantly varying thickness. As a result, the time of the oxide etch must be set significantly higher, say by 100%, than the etch of the design thickness to assure penetration of the oxide. This is called over etch, which also accounts for other variations. However, for the regions with a thinner oxide, the nitride is exposed that much longer to the etching environment.

Ultimately, the required degree of selectivity is reflected in the probability of an electrical short between the gate structures 18 and the metal filled into the contact hole 28. However, scanning electron micrographs (SEMs) of the etched structure of FIG. 1 quickly reveal if an excessive amount of nitride is being removed. The etch must also be selective to photoresist, for example at facets that develop at the mask corners, but the requirement of photoresist selectivity is not so stringent since the photoresist layer 26 may be made much thicker than the nitride layer 22.

Blalock et al. have disclosed a SAC oxide etch process in U.S. Pat. No. 5,286,344. Their sole detailed example using an etching gas of relative composition is given in TABLE 1, as near as can be understood. Note, however, that the percentages sum to greater than 100%.

TABLE 1

| Gas | Relative Amount |
| --- | --- |
| $CF_4$ | 16% |
| $CHF_3$ | 9% |
| $CH_2F_2$ | 20% |
| Ar | 57% |

They use a plasma reactor having two opposed capacitor plates. The lower capacitor plate supports the wafer, and 500 W of RF power is applied to the lower plate. The upper plate and the rest of the chamber are grounded. Static or low-frequency induction coils are placed to the side of the chamber to apply 500 gauss of nearly static magnetic field to the plasma. That is, the process is magnetically enhanced reactive ion etching. The etching gas is maintained at a chamber pressure of 200 milliTorr. Blalock et al. achieve a nitride selectivity of 30:1 and an etch rate of 400 nm/min. The selectivity is satisfactory, but the etch rate is considered to be low. Adopting the recipe of Blalock et al. to an advanced etcher utilizing a high-density plasma is problematic.

In the future, the most demanding etching steps are projected to be performed with high-density plasma (HDP) etch reactors. Such HDP etch reactors achieve a high-density plasma having an ion density of $10^{11}$ cm$^{-3}$ and above across the plasma exclusive of the sheathes. Although several techniques are available for achieving a high-density plasma are available such as electron cyclotron resonance and remote plasma sources, the commercially most important technique involves inductively coupling RF energy into the source region. The inductive coil may be cylindrically wrapped around the sides of chamber or be a flat coil above the top of the chamber or represent some intermediate geometry. An example of such an inductively coupled etch reactor is illustrated in the cross-sectional view of FIG. 2 and represents the IPS Etch Reactor available from Applied Materials, Inc. of Santa Clara, Calif. and described by Collins et al. in U.S. patent application Ser. No. 08/733,544, filed Oct. 21, 1996. As shown in FIG. 2, a wafer 30 to be processed is tightly supported on a cathode pedestal 32 supplied with RF power from a first RF power supply 34. The RF power applied to the pedestal 32 creates a DC self-bias field at the edge of the plasma next to the wafer 30. A silicon ring 36 surrounds the pedestal 32 and is controllably heated by an array of heater lamps 38. A grounded silicon wall 40 surrounds the plasma processing area. A silicon roof 42 overlies the plasma processing area, and lamps 44 and water cooling channels 46 control its temperature. The temperature-controlled silicon ring 36 and silicon roof 42 scavenge fluorine from the fluorocarbon plasma. Processing gases are supplied from a plurality of gas sources 47 and are controlled by respective mass flow controllers 48 before being combined and injected into the chamber through a top gas feed 50 formed in the roof 42. The top gas feed 50 has a showerhead dispensing structure including a distribution cavity and fifteen 250 µm holes through the silicon roof 42 connecting the cavity to the chamber. An unillustrated vacuum pumping system connected to a pumping channel 52 around the lower portion of the chamber maintains the chamber at a preselected pressure.

In the used configuration, the silicon roof 42 is grounded, but its semiconductor resistivity and thickness are chosen to pass generally axial RF magnetic fields produced by an inner inductive coil stack 56 and an outer inductive coil stack 58 powered by respective RF power supplies 60, 62. However, a single RF power supply with an adjustable power splitter may be used. These coils 56, 58 inductively couple RF energy into the plasma source region spatially removed from the wafer 30. Thereby, the pedestal biasing is decoupled from the plasma generation.

It has become recognized, particularly in the use of HDP etch reactors, that selectivity in an oxide etch can be achieved by a fluorocarbon etching gas forming a polymer layer upon the non-oxide portions, thereby protecting them from etching, while the oxide portions remain exposed to the etching environment. It is believed that the temperature controlled silicon ring 36 and roof 42 in the reactor of FIG. 2 controls the fluorine content of the polymer, and hence its effectiveness against etching by the fluorocarbon plasma, when the polymer overlies a non-oxide. However, this mechanism seems to be responsible for at least two problems if high selectivity is being sought. If excessive amounts of polymer are deposited on the oxide or nitride surfaces in the contact hole being etched, the hole can close up and the etching is stopped prior to complete etching of the hole. This condition is referred to as etch stop.

Further, the chemistry may be such that the polymer formation depends critically upon the processing conditions. It may be possible to achieve high selectivity with one set of processing conditions, but very small variations in those parameters may be enough to substantially reduce the selectivity on one hand or to produce etch stop on the other. Such variations can occur in at least two ways. The conditions at the middle of the wafer may vary from those at the center. Furthermore, the conditions may change over time on the order of minutes as the chamber warms up or on the order of days as the equipment ages or as chamber parts are replaced. It is felt that hardware can be controlled to no better than ±5 or 6%, and a safety margin of 3 to 6 is desired. Mass flow controllers 48 are difficult to control to less than ±1 sccm (standard cubic centimeter per minute) of gas flow so gas flows of any constituent gas of only a few sccm are prone to large percentage variations.

These factors indicate that a commercially viable etch process must have a wide process window. That is, large variations in gas composition should produce only minimal changes in the resultant etching.

Several oxide etch processes have been proposed which rely upon higher-order hydrogen-free fluorocarbons and hydrofluorocarbons, both generically referred to as fluorocarbons. Examples of higher-order fluorocarbons are fluoroethane, fluoropropane, and even fluorobutane, both in its linear and cyclic forms. In U.S. Pat. No. 5,423,945, Marks et al. disclose an oxide etch selective to nitride using $C_2F_6$ in an HDP etch reactor having a thermally controlled silicon surface. Later process work with the IPS chamber of FIG. 2 has emphasized $C_4F_8$ as the principal etchant species. Many of the higher-order fluorocarbons and hydrofluorocarbons are not readily available, especially in semiconductor-grade purity. Furthermore, their toxicity may be unproven, necessitating close review prior to their large-scale use. Even their environmental effects may need further understanding. Hence, it is more desirable to use the already popular fluoromethanes, which include carbon tetrafluoride ($CF_4$), trifluoromethane ($CHF_3$), difluoromethane ($CH_2F_2$), and monofluoromethane ($CH_3F$).

SUMMARY OF THE INVENTION

The invention can be summarized as an oxide etch process that is particularly useful in its high selectivity to nitride. The two principal etching gases are difluoromethane ($CH_2F_2$) and trifluoromethane ($CHF_3$) with a larger fraction of trifluoromethane. An inactive diluent gas such as argon is added in a substantially larger amount. The process is preferably performed in a high-density plasma reactor and at a pressure below about 20 milliTorr. Substantial RF bias power is applied to the pedestal holding the wafer. Preferably, silicon surfaces in the chamber are heated or otherwise activated to scavenge fluorine from the plasma.

BRIEF DESCRIPTION OF THE DRAWINGS

FIG. 1 is a cross-sectional view of a self-aligned contact structure achievable by use of the invention.

FIG. 2 is a schematic cross-sectional view of an inductively coupled plasma reactor in which the invention may be practiced.

DETAILED DESCRIPTION OF THE PREFERRED EMBODIMENTS

We have established an oxide etch recipe based upon some theoretical considerations. We have shown that the recipe can be used to etch a self-aligned contact (SAC) structure with a high etch rate and with high selectivity to nitride. We have also demonstrated that the recipe can be used in a process manifesting a wide process window.

Advanced structures should be etched in high-density plasma (HDP) reactors such as the IPS reactor of FIG. 2 in order to etch deep holes with large aspect ratios. The pedestal should be strongly biased to draw the ionized fraction of the etch gas into the bottom of the hole so as to achieve both highly anisotropic etching and etching of holes of high aspect ratios. A large amount of an inactive diluent gas such as argon or helium should be used to prevent etch stop at the bottom of the holes. With a high dilution, etch byproducts are quickly pumped from the chamber. The chamber should be maintained at a pressure well below 100 milliTorr in order to prevent the ionized etching gas atoms from colliding with other gas particles, thereby decreasing the ionization fraction and randomizing the ion flow. Preferably, silicon-based surfaces in the chamber scavenge fluorine from the plasma, but thermal activation of the silicon should be kept to moderately low temperatures for considerations of maintenance and endurance of the equipment.

The active etching gas should be limited to the fluoromethanes for reasons of cost, toxicity, and availability. This limitation is not considered severe in an HDP process in which the plasma power is so high that higher-order fluorocarbons are likely to be dissociated into the same type of fragments, whether radicals or ions, as are the fluoromethanes. Of the fluoromethanes, we believe that monofluoromethane produces too narrow a process window, probably because it is a strong polymer former. Carbon tetrafluoride is a strong oxide etcher, but this strength is not particularly required in an HDP etch reactor in which a strong plasma is produced in the source region. Further, we believe that the high-density plasma produces many of the same etching radicals from $CH_2F_2$ as from $CF_4$, for example, $CHF_x^*$, where x is 1 or 2, and $CF_x^*$, where x is 1, 2 or 3. Also, $CF_4$ is not known for a high selectivity to nitride. Both of the remaining fluorocarbons, difluoromethane ($CH_2F_2$) and trifluoromethane ($CHF_3$) should be used in combination. Difluoromethane is a stronger polymer former, and trifluoromethane is a stronger oxide etcher. As a result, varying the relative proportion of the two active etchants can be used to obtain the optimal balance of fast etching, reduced etch stop, and polymer-controlled selectivity. Nonetheless, the two constituent active gases are close enough in chemistry that small variations in their relative proportions will produce relatively small changes in selectivity and etching. That is, a wide process window is expected with the proper combination of $CH_2F_2$ and $CHF_3$.

Finally, the flow of etching reactive gases $CHF_3$ and $CH_2F_2$ should be kept low to minimize etch stop but not so low as to present resolution problems in the mass flow controllers.

Based on these considerations, we performed a series of experiments to establish a matrix of processing trends for a SAC process. A short example of a matrix will be described. The source power was varied in the range of 1950 to 2540, and the pressure was varied from 20 to 50 milliTorr. The total reactive flow is defined as the sum of the $CHF_3$ and $CH_2F_2$, and the reactive gas ratio is defined as the ratio of the $CH_2F_2$ flow to the total reactive flow. For the matrix study, the total flow was varied between 70 and 120 sccm for the 22 liter IPS chamber of FIG. 2 pumped by a 2000 liter/min turbo pump, and the reactive gas flow was varied between 17% and 57%. A series of wafers with a SAC type of structure were etched with different values of the above parameters. After etching, the wafers were examined by SEM. Three etching effects were loosely quantized, the nitride loss (nitride etching rate or inverse of selectivity), the nitride corner angle related to an anisotropic etch, and the etch stop depth. The results are presented in TABLE 2, in which the positive or negative numbers indicate the intensity of a beneficial or poor trend respectively for increasing values of the process parameters.

TABLE 2

|  | Nitride Loss | Nitride Corner Angle | Etch Stop Depth |
| --- | --- | --- | --- |
| Source Power | +2 | +2 | +2 |
| Total Flow | −3 | −1 | −3 |
| Pressure | −3 | −1 | −2 |
| Gas Ratio | −1 | −3 | −1 |

From these results, we tried a number of recipes in which we attempted to balance the process effects by following the trends indicated in TABLE 2. We quickly arrived at a baseline recipe using the flows listed in TABLE 3 at a pressure of 20 milliTorr.

TABLE 3

| Gas | Flow (sccm) | Relative Flow |
| --- | --- | --- |
| $CHF_3$ | 73 | 14% |
| $CH_2F_2$ | 51 | 10% |
| Ar | 400 | 76% |

In this recipe as tested, all RF power supplies have frequencies in the neighborhood of 2 MHz. The inner coil 56 is supplied with 450 W of RF power; the outer coil 58, with 1600 W, for a total of 2050 W of source power. The pedestal 32 is biased with 1800 W of RF power. The silicon ring 36 is maintained at 270° C., and the silicon wall 40 and roof 42, at 200° C. The pedestal 32 is supplied with chilled water at 15° C., and backside gas cooling between the wafer 30 and pedestal 32 is achieved with helium held at 7 Torr.

The design etch time is 60 seconds, but up to a 100% over etch may be included in the recipe, that is, 120 second of etching in the baseline process.

The recipe is distinguished from Blalock et al. on several grounds. Blalock et al. use a low-density plasma while the inventive recipe uses a high-density plasma or at least a separately controlled inductively coupled plasma source region. Blalock et al. rely upon $CF_4$ and to a lesser extent $CHF_3$ as the primary active components, and they consider $CH_2F_2$ to be an additive. The recipe of this inventive embodiment does not include a substantial amount of $CF_4$, but instead uses both $CH_2F_2$ and $CHF_3$ to provide some etching strength, although $CHF_3$ is the stronger etcher. A substantial amount of $CF_4$ in the present invention would be considered to be 25% of the flow of $CH_2F_2$. Blalock et al. use less $CHF_3$ than $CH_2F_2$ since most of the etching strength is provide by $CF_4$. In contrast, the present recipe uses more $CHF_3$ than $CH_2F_2$. Also, the present recipe uses 76% of argon in contrast to the 57% of Blalock et al. The higher argon density allows deeper etching in narrow contact holes.

The recipe and its process window were tested with a series of test wafers having a structure resembling that of FIG. 1. The width of the contact holes 28 was about 0.5 μm while the width of the gap 20 was about 0.18 μm. The thickness of the oxide 24 was nominally 0.8 μm, but it was observed to vary from 0.7 to 0.9 μm. The height of the nitride step over the gate structure 18 was about 0.6 μm, and the thickness of the nitride over the gate structure 18 was about 0.3 μm. There was no nitride 22 at the bottom 23 of the gap 20, and an oxide substrate layer was used in place of the silicon substrate 10 to better quantify the oxide over etch. Hence, nitride selectivity was measured on the nitride corner 29, in any case the more demanding test.

The baseline recipe produced an oxide etch rate of 0.85 μm/min and a nitride selectivity of at least 30:1. Uniformity around the wafer was satisfactory.

To establish a satisfactory process window, the baseline recipe was then varied, as tabulated in TABLE 4, by about 10% in either direction for all major parameters except the chiller temperature and the backside helium pressure. It is felt that a ±10% process window affords adequate control of the fabrication equipment in a production line environment over substantial periods without the need to recalibrate the recipe. Any control to a window narrower than about ±5% is considered too difficult for a production line.

TABLE 4

|  | Increase | Decrease |
| --- | --- | --- |
| Source Power | +200 W | −205 W |
| Bias Power | +200 W | −200 W |
| $CHF_3$ | +3 sccm | −3 sccm |
| $CH_2F_2$ | +3 sccm | −3 sccm |
| Pressure | +2mT | −2mT |
| Chiller Temp. | / | −30° C. |
| He Pressure | +8T | / |
| Ring Temp. | +50° C. | −50° C. |

That is, in a series of experiments, all but one of the major parameters were held at the baseline, and that other parameter was varied alternatively +10% and −10% for separate wafers. The source power variation was proportionately applied to the inner and outer coils. After the structure was etched, the wafer was sectioned and a scanning electron micrograph (SEM) was exposed and visually examined both at the wafer center and at four points around the wafer periphery.

With one exception, the etching produced at the edges of the process window were completely satisfactory. The one exception was the increase of bias power to the pedestal. At one of the four peripheral locations, the baseline recipe showed polymer buildup, but etching was completed. However, at this same location, when the bias power was increased from 1800 W to 2000 W, this same location showed etch stop about ⅔ of the way down the contact hole. Hence, it is believed prudent to reduce the baseline bias power towards 1600 W.

The tests did not establish the extended bounds of the process window. It is expected that the window for the active species $CH_2F_2$ and $CHF_3$ can be extended to ±20%. The operating regime is with more $CHF_3$ than $CH_2F_2$. It is also believed that the argon fraction can be reduced to 60% or less preferably even 50%. The upper bound for the argon fraction is limited by a commercially viable etching rate. The chamber pressure is considered to be non-crucial to at least a window of ±20%, and probably the window extends between 10 and 50 milliTorr.

The source power similarly is expected to have a ±20% process window. The extended window for the bias power, however, is expected to be +10% and −30%. The temperature of the silicon ring can be significantly increased since high-temperature scavenging is known to produce superior polymer coatings. The minimum silicon scavenger temperature is probably in the neighborhood of 180° C., but the necessity of any thermally activated scavenging by solid silicon is not clear. The silicon temperature window is easily achievable in the IPS chamber. The chiller temperature and the helium backside pressure are not considered crucial for the etching process, but are more concerned with total thermal budget of the wafer.

Although the process recipe was developed for a nitride-selective SAC process, similar considerations apply to a silicon-selective process in which $CHF_3$ and $CH_2F_2$ are the principal etching gases. The process recipe is also expected to vary somewhat with alternative designs for the HDP etching chamber.

Although the described chamber has provided beneficial results, the invention is applicable to other types of etching chambers. The gases may be injected into the chamber from other positions, and the flow proportions through different injection ports may be different as long as the total flows conform to the invention. The arrangement of the inductive coils may be changed in a number of ways now well known both commercially and in the literature. Other types of HDP reactors may beneficially use the chemistry presented here.

Thermally controlled silicon scavenging may be substituted by a number of alternative methods. Silicon carbide has been suggested as a rugged, strong fluorine scavenger. The silicon can be activated by RF biasing, for example, by applying RF power to the silicon roof. Also gaseous scavengers such as silane ($SiH_4$), compound silanes, and tetraethylorthosilicate (TEOS) may be used.

The invention provides a simple oxide etching process uses commonly available gases in a production-worthy process exhibiting a fast oxide etching rate, a high selectivity, especially to nitride, and a wide process window for many important process parameters.

What is claimed is:

1. A process for selectively etching oxide over nitride, comprising:

placing a substrate comprising an oxide layer overlying a nitride layer into a plasma chamber;

injecting into said chamber a gas mixture comprising a first amount of difluoromethane, a second amount of trifluoromethane, and a third amount of an inactive gas selected from the group consisting of argon and helium, said first, second, and third amounts summing to a fourth amount;

exciting said gas mixture into a plasma to thereby selectively etch said oxide layer over said nitride layer;

wherein a first ratio between said first and fourth amounts has a value of 10%±2%; and wherein a second ratio between said second and fourth amounts has a value of 14% ±2.8%.

2. The process of claim 1, wherein a third ratio between said third and fourth amounts has a value of at least 76%.

3. The process of claim 1, wherein said first ratio has a value of 10%±1% and said second ratio has a value of 14% ±1.4%.

4. The process of claim 1, wherein said exciting step creates a high-density plasma in said chamber.

5. The process of claim 4, wherein said exciting step includes inductively coupling a first RF power into said chamber and further comprising biasing a pedestal supporting said substrate with a second RF power.

6. The process of claim 5, wherein said first RF power is greater than said second RF power.

7. The process of claim 2, further comprising maintaining a silicon-containing surface of said chamber at an elevated temperature to scavenge fluorine from said plasma.

8. The process of claim 7, wherein said elevated temperature is at least 270° C.

9. The process of claim 1, wherein said gas mixture includes substantially no carbon tetrafluoride.

* * * * *